(12) United States Patent
Vafin et al.

(10) Patent No.: US 10,903,853 B2
(45) Date of Patent: Jan. 26, 2021

(54) COMPUTATION OF FORWARD ERROR CORRECTION DATA UNITS USING LOSS VECTOR PROBABILITIES

(71) Applicant: Microsoft Technology Licensing, LLC, Redmond, WA (US)

(72) Inventors: Renat Vafin, Tallinn (EE); Soren Vang Andersen, Esch-sur-Alzette (LU); Mattias Nilsson, Sundbyberg (SE)

(73) Assignee: Microsoft Technology Licensing, LLC, Redmond, WA (US)

( * ) Notice: Subject to any disclaimer, the term of this patent is extended or adjusted under 35 U.S.C. 154(b) by 231 days.

(21) Appl. No.: 16/103,681

(22) Filed: Aug. 14, 2018

(65) Prior Publication Data
US 2019/0007060 A1  Jan. 3, 2019

Related U.S. Application Data

(63) Continuation of application No. 14/054,609, filed on Oct. 15, 2013, now Pat. No. 10,498,359, which is a
(Continued)

(30) Foreign Application Priority Data

Jul. 14, 2011  (GB) ................... 1112110.0

(51) Int. Cl.
*H03M 13/00* (2006.01)
*H03M 13/05* (2006.01)
*H04L 1/00* (2006.01)

(52) U.S. Cl.
CPC .......... *H03M 13/05* (2013.01); *H04L 1/0009* (2013.01); *H04L 1/0015* (2013.01);
(Continued)

(58) Field of Classification Search
CPC ........ H03M 13/05; H04L 1/00; H04L 1/0009; H04L 1/0015; H04L 1/0033; H04L 1/0057; H04L 1/0083
See application file for complete search history.

(56) References Cited

U.S. PATENT DOCUMENTS 5,600,663 A * 2/1997 Ayanoglu .............. H03M 13/35
714/751
6,169,728 B1   1/2001 Perreault et al.
(Continued)

FOREIGN PATENT DOCUMENTS

CN        1878049 A    12/2006
CN      101193060 A    12/2006
(Continued)

OTHER PUBLICATIONS

"Office Action Issued in United Kingdom Patent Application No. 1112110.0", dated Aug. 1, 2017, 5 Pages.
(Continued)

*Primary Examiner* — Albert Decady
*Assistant Examiner* — Enamul M Kabir
(74) *Attorney, Agent, or Firm* — Schwegman Lundberg & Woessner, P.A.

(57) ABSTRACT

Correction data units for data packets of a data stream are generated. A correction data unit is based on a set of the data packets of the stream. The stream is transmitted over a communication channel. A performance measure to be optimized is selected, which relates to the recovery of lost data packets of the stream. To optimize the performance measure, a plurality of correction data vectors are determined, and a plurality of a plurality of non-recovery probabilities, corresponding to the correction data vectors, are initialized. One or more of the correction data vectors are selected that contribute towards a non-recovery probability of an original data packet. The non-recovery probability associated with
(Continued)

the original data packet is then minimized based on the selected one or more correction data vectors. The selected one or more correction data vectors are then used to determine which of the original data packets or data correction units to transmit.

20 Claims, 6 Drawing Sheets

Related U.S. Application Data continuation-in-part of application No. 13/295,864, filed on Nov. 14, 2011, now Pat. No. 9,166,735.

(52) U.S. Cl.
CPC .......... *H04L 1/0033* (2013.01); *H04L 1/0057* (2013.01); *H04L 1/0083* (2013.01)

(56) References Cited

U.S. PATENT DOCUMENTS

| | | | |
|---|---|---|---|
| 6,421,387 B1 | 7/2002 | Rhee | |
| 6,741,569 B1 | 5/2004 | Clark | |
| 7,224,702 B2* | 5/2007 | Lee | H04L 1/1809 370/473 |
| 7,447,977 B2 | 11/2008 | Bauer et al. | |
| 7,971,121 B1 | 6/2011 | Conway | |
| 8,037,392 B1 | 10/2011 | Sahar | |
| 8,300,563 B2 | 10/2012 | Krishnaswamy et al. | |
| 8,340,162 B2 | 12/2012 | Tzannes | |
| 9,166,735 B2 | 10/2015 | Vafin et al. | |
| 10,498,359 B2 | 12/2019 | Vafin et al. | |
| 2002/0069038 A1* | 6/2002 | Cooper | H04L 1/0009 702/191 |
| 2003/0031128 A1* | 2/2003 | Kim | H04N 5/147 370/229 |
| 2003/0099298 A1* | 5/2003 | Rose | H04N 19/89 375/240.27 |
| 2005/0160346 A1 | 7/2005 | Yamane | |
| 2006/0064626 A1* | 3/2006 | Fischer | H03M 13/09 714/776 |
| 2006/0150055 A1 | 7/2006 | Quinard et al. | |
| 2006/0253763 A1 | 11/2006 | Oliva et al. | |
| 2006/0259627 A1 | 11/2006 | Kellerer et al. | |
| 2006/0268933 A1 | 11/2006 | Kellerer et al. | |
| 2006/0280205 A1* | 12/2006 | Cho | H04L 47/10 370/473 |
| 2007/0022361 A1* | 1/2007 | Bauer | H04L 1/0014 714/776 |
| 2007/0058669 A1 | 3/2007 | Hoffmann et al. | |
| 2008/0134005 A1 | 6/2008 | Izzat et al. | |
| 2009/0080510 A1* | 3/2009 | Wiegand | H03M 13/03 375/240.01 |
| 2009/0193314 A1* | 7/2009 | Melliar-Smith | H03M 13/2921 714/755 |
| 2009/0252050 A1* | 10/2009 | Jiang | H04L 1/0009 370/252 |
| 2010/0017686 A1 | 1/2010 | Luby et al. | |
| 2010/0077276 A1* | 3/2010 | Okamura | H04L 1/1812 714/752 |
| 2010/0122127 A1 | 5/2010 | Oliva et al. | |
| 2010/0142522 A1* | 6/2010 | Gardner | H04L 1/0009 370/389 |
| 2010/0195488 A1* | 8/2010 | Mehrotra | H04L 47/25 370/216 |
| 2010/0202309 A1 | 8/2010 | Suneya | |
| 2010/0296000 A1* | 11/2010 | Henocq | H04N 21/8451 348/723 |
| 2011/0302473 A1* | 12/2011 | Zhou | H04L 1/008 714/755 |
| 2012/0008940 A1 | 1/2012 | De Lind Van Wijngaarden | |
| 2012/0054585 A1* | 3/2012 | Jiang | H03M 13/1111 714/777 |
| 2012/0287986 A1 | 11/2012 | Paniconi et al. | |
| 2012/0307934 A1 | 12/2012 | Heidari et al. | |
| 2013/0019136 A1 | 1/2013 | Vafin et al. | |
| 2013/0100968 A1 | 4/2013 | Vafin et al. | |
| 2014/0047303 A1 | 2/2014 | Vafin et al. | |

FOREIGN PATENT DOCUMENTS

| | | |
|---|---|---|
| EP | 713302 A2 | 5/1996 |
| EP | 2719103 A1 | 4/2014 |
| GB | 2315393 A | 1/1998 |
| WO | 9736377 A1 | 10/1997 |
| WO | 0072496 A1 | 11/2000 |
| WO | 2005041533 A1 | 5/2005 |
| WO | 2008021470 A1 | 2/2008 |
| WO | 2013010153 A1 | 1/2013 |

OTHER PUBLICATIONS

"Office Action Issued in United Kingdom Patent Application No. 1112110.0", dated Oct. 6, 2017, 6 Pages.
"Office Action Issued in United Kingdom Patent Application No. 1112110.0", dated Dec. 21, 2017, 4 Pages.
"Office Action Issued in United Kingdom Patent Application No. 1112110.0", dated Mar. 6, 2018, 2 Pages.
"Search Report Issued in United Kingdom Patent Application No. 1112110.0", dated Oct. 31, 2012, 3 Pages.
"Office Action Issued in European Patent Application No. 12740813.6", dated Jan. 19, 2018, 4 Pages.
"Final Office Action Issued in U.S. Appl. No. 13/295,864", dated Feb. 14, 2014, 18 Pages.
"Final Office Action Issued in U.S. Appl. No. 13/295,864", dated Jan. 16, 2015, 23 Pages.
"Non Final Office Action Issued in U.S. Appl. No. 13/295,864", dated Jun. 20, 2014, 22 Pages.
"Non Final Office Action Issued in U.S. Appl. No. 13/295,864", dated Jun. 21, 2013, 18 Pages.
"Final Office Action Issued in U.S. Appl. No. 14/054,609", dated Dec. 29, 2016, 20 Pages.
"Final Office Action Issued in U.S. Appl. No. 14/054,609", dated May 10, 2018, 25 Pages.
"Non Final Office action Issued in U.S. Appl. No. 14/054,609", dated Jun. 30, 2016, 28 Pages.
"Non Final Office action Issued in U.S. Appl. No. 14/054,609", dated Jun. 30, 2017, 23 Pages.
"First Office Action and Search Report Issued in Chinese Patent Application No. 201280034933.1", dated Dec. 23, 2015, 13 Pages.
Dubois-Ferriere, et al., "Packet Combining in Sensor Networks", In Proceedings of the 3rd International Conference on Embedded Networked Sensor Systems, Nov. 2005, 14 Pages.
Frossard, Pascal, "FEC Performance in Multimedia Streaming", in Proceedings of IEEE Communications Letters, vol. 5, Issue 3, Mar. 1, 2001, 3 Pages.
"International Search Report & Written Opinion Issued in PCT Application No. PCT/US2012/046822", dated Sep. 28, 2012, 11 Pages.
"Office Action Issued in European Patent Application No. 12740813.6", dated Nov. 20, 2019, 4 Pages.

* cited by examiner

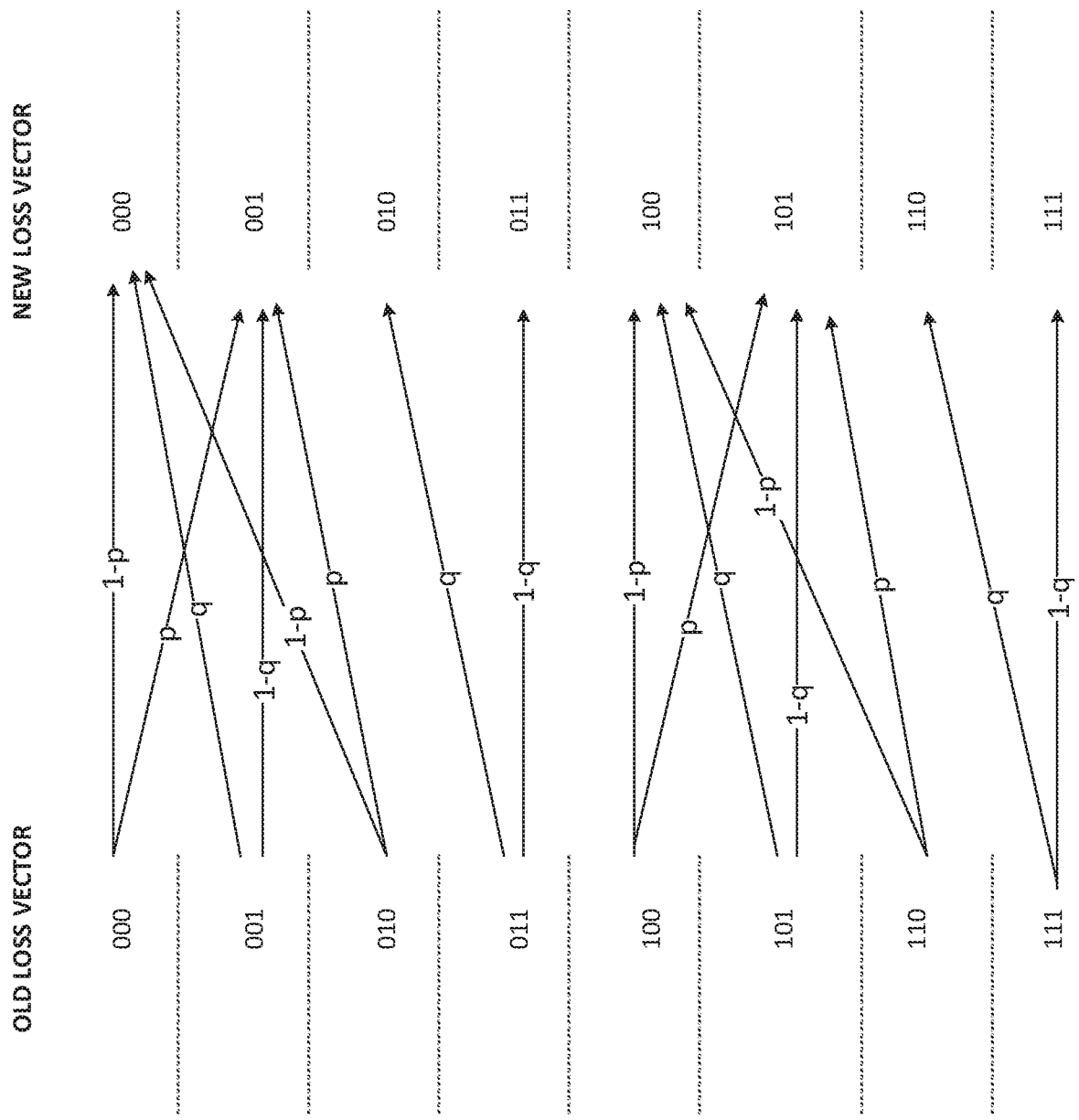

COMPUTATION OF FORWARD ERROR CORRECTION DATA UNITS USING LOSS VECTOR PROBABILITIES

CROSS-REFERENCE TO RELATED APPLICATIONS

This application is a continuation of U.S. patent application Ser. No. 14/054,609, filed Oct. 15, 2013 and titled "CORRECTION DATA." which is a Continuation-in-Part of U.S. application Ser. No. 13/295,864, filed Nov. 14, 2011, titled "Correction Data", which claims priority under 35 USC 119 or 365 to Great Britain Application No. 1112110.0 filed Jul. 14, 2011, the disclosures of which are incorporated in their entirety.

BACKGROUND

There are many situations in which a data stream is transmitted from a transmitter to a receiver over a communication channel. A communication channel may exist in one (or more) of many different possible networks. For example, a communication channel may exist in the internet or in a wireless network such as a mobile telecommunications network. The data in a data stream may be divided into data packets for transmission over a communication channel. The protocol for dividing the data into data packets (e.g. the form of the headers of the data packets, and other such implementation details) may depend upon the nature of the communication channel on which the data is to be transmitted, e.g. the type of network through which the data packet is to be transmitted. The data may be encoded by an encoder prior to transmission from the transmitter and decoded by a decoder after reception at the receiver.

In an ideal system, the communication channel is lossless such that every data packet transmitted from the transmitter over the communication channel is received at the receiver. However, in real physical systems, the communication channel may be lossy, meaning that some of the transmitted data packets will be lost on the communication channel and as such will not be received at the receiver, this may be detrimental. Correction schemes can be used to help recover, at the receiver, at least some of the lost data packets.

As an example, forward error correction (FEC) is one correction scheme which can be used to combat packet loss in a communication channel. FEC produces redundant data (as FEC data units) in addition to the original data packets and includes the FEC data units in the data stream which is transmitted over the communication channel. The redundant FEC data units may be placed in their own packets, separate to the data packets in the data stream. Alternatively, or additionally, the FEC data units may be appended (or "piggybacked") to the original data packets in the data stream. When some of the original data packets are lost in the communication channel, the successfully arrived FEC data units and the successfully arrived data packets can be used to recover (at least some of) the lost data packets. That is, FEC reduces the packet loss seen by a decoder of the receiver, compared to the actual packet loss in the communication channel.

FIGS. 1a, 1b and 1c illustrate three examples of how a FEC data unit may be generated. As illustrated in FIG. 1a, a FEC data unit 104 may be generated as an exact copy of an original data packet 102 of the data stream. By including both the data packet 102 and the FEC data unit 104 in the data stream, the data in the data packet 102 is transmitted twice. Therefore if the data packet 102 is lost during transmission but the FEC data unit 104 is successfully received then the data in the data packet 102 can be successfully recovered at the receiver (using the FEC data unit 104). As illustrated in FIG. 1b a module 108 may be used to generate a FEC data unit 110 which is a copy of an original data packet 106 encoded at a lower bit rate. If the data packet 106 is lost during transmission but the FEC data unit 110 is successfully received then the data in the data packet 106 can be at least partially recovered at the receiver based on the FEC data unit 110. It should be noted that if the data packets 102 and 106 have the same size (e.g. the same number of bits) then the FEC data unit 110 will have a smaller size (e.g. fewer bits) than the FEC data unit 104. Therefore, although the FEC data unit 104 may be more useful in recovering the data packet 102 than the FEC data unit 110 is in recovering the data packet 106, it may be beneficial to generate FEC data units as shown in FIG. 1b since the FEC data unit 110 uses less of the available bit rate on the communication channel for the data stream than the FEC data unit 104 uses. As illustrated in FIG. 1c a mixing module 118 may be used to generate a FEC data unit 120 from a plurality of the original data packets, e.g. data packets 112, 114 and 116. Finite field (Galois field) arithmetic may be used to combine original data packets. For example the mixing module 118 may determine the bit-by-bit result of an XOR function applied to the three data packets 112, 114 and 116 to generate the FEC data unit 120. In another approach, data packets 112, 114 and 116 are combined byte-by-byte using Galois field $GF(2^8)$ arithmetic to generate the FEC data unit 120. In this sense the FEC data unit 120 is the result of combining or mixing the original data packets 112, 114 and 116. If one of the data packets 112, 114 and 116 is lost during transmission but the other two data packets and the FEC data unit 120 are successfully received then the data in the lost data packet can be successfully recovered at the receiver (using the other two data packets and the FEC data unit 120).

It can therefore be seen that FEC data units may be generated in a number of different ways. Different FEC schemes describe different ways in which the FEC data units are to be generated. A FEC scheme may describe factors relating to the generation of the FEC data units, such as: the number of FEC data units that are generated; which data packets are used to generate the FEC data units; how the FEC data units are transmitted (e.g. as separate packets or by appending the FEC data units to the data packets); and where in the data stream the FEC data units are placed. The loss-recovery performance of a FEC scheme describes the ability of the FEC scheme to recover lost data packets at the receiver using the FEC data units.

Generally, increasing the number of FEC data units in the data stream improves the loss-recovery performance of a FEC scheme. However, increasing the number of FEC data units in the data stream comes at a cost of bit rate efficiency. If the coding bit rate of original data packets is kept unchanged, then increased redundancy (e.g. by increasing the number of FEC data units in the data stream) leads to increased total bit rate. Alternatively, if the total bit rate available for the data stream on the communication channel is constrained, then increased redundancy (e.g. by increasing the number of FEC data units in the data stream) comes at a price of reduced coding bit rate of the original data packets. It is therefore an aim to balance the conflicting factors of the loss-recovery performance of the FEC with the bit rate efficiency of the data stream.

One class of algorithm for designing an appropriate FEC scheme is based on error-correcting and erasure codes known from communication theory. One example of such codes is Reed-Solomon codes. The codes are designed according to certain scenarios in which the FEC may operate, to ensure recovery of all lost data packets if the number of lost data packets does not exceed a predetermined maximum.

Another class of algorithm for designing an appropriate FEC scheme is based on training. Training is performed offline. Given channel conditions and coding requirements for the FEC data units (e.g. (i) the FEC overhead which sets the ratio of redundant data relative to the original data in the data stream, for example the number of FEC data units relative to the number of original data packets in the data stream, and (ii) the FEC depth which sets the maximum allowable displacement in the data stream between the oldest and the newest data packet that can be protected by (or combined into) each FEC data unit), optimal combinations/mixings of the original data packets are trained to optimize for a loss-recovery performance within an optimization window. Since the number of relevant channel conditions, FEC overheads, and FEC depths can be high, the number of trained schemes can be high too.

The classes of algorithms for designing an appropriate FEC scheme described above determine an appropriate FEC scheme for use within an optimization window. That is, a FEC scheme is set for the optimization window with the aim of optimizing the performance of the FEC during the optimization window. The optimization window may be a length of time (e.g. one second) or the optimization window may be a number of data packets of the data stream (e.g. ten data packets). At the end of the optimization window, the FEC scheme may be set again for the next optimization window.

SUMMARY

According to one embodiment disclosed herein a method of transmitting a data stream over a communication channel, where the method includes determining a first plurality of correction data vectors corresponding to a plurality of correction data units based on a plurality of original data packets of a data stream to be transmitted from a transmitter to a receiver over a communication channel, initializing a plurality of non-recovery probabilities, wherein each non-recovery probability is associated with a corresponding correction data vector selected from the first plurality of correction data vectors, and determining a second plurality of correction data vectors from the first plurality of correction data vectors, where the second plurality of correction data vectors contribute towards a non-recovery probability of a particular original data packet selected from the plurality of original data packets. The method also includes minimizing the non-recovery probability of the particular original data packet based on the determined second plurality of correction data vectors, selecting a correction data vector from the second plurality of correction data vectors having a least value relative to the second plurality of correction data vectors, and transmitting original data packets and correction data units corresponding to the selected correction data vector.

In another embodiment of the method, a correction data vector selected from the plurality of correction data vectors is defined by a predetermined number of original data packets selected from the plurality of original data packets and a predetermined number of correction data units selected from the plurality of correction data units.

In a further embodiment of the method, a loss probability selected from the plurality of non-recovery probabilities is determined based on a steady state probability of a first original data packet being successfully transmitted.

In yet another embodiment of the method, the non-recovery probability is further determined based on a first transition probability corresponding to a successful transmission of an original data packet selected from the plurality of original data packets and on a second transition probability corresponding to a successful transmission of a correction data unit selected from the plurality of correction data units.

In yet a further embodiment of the method, a correction data vector of the first plurality of correction data vectors is determined to contribute to the non-recovery probability of the particular original data packet where the particular original data packet is identified as being lost and the corresponding correction data unit is identified as being lost.

In another embodiment of the method, the method includes comprising updating the plurality of loss probabilities based on at least one most recent original data packet and on at least one most recent correction data unit transmitted from the transmitter to the receiver.

In a further embodiment of the method, updating the plurality of non-recovery probabilities comprises associating a transition probability with a first correction data vector, wherein the first correction data vector corresponds to a non-recovery probability selected from the plurality of non-recovery probabilities, determining a second correction data vector based on the first correction data vector, and determining a non-recovery probability for the second correction data vector based on the transition probability of the first correction data vector and the non-recovery probability corresponding to the first correction data vector.

The embodiments disclosed herein further include a system for transmitting a data stream over a communication channel, the system having a computer-readable memory device storing computer-executable instructions, and one or more hardware processors that, having executed the computer-executable instructions, configure the system to determine a first plurality of correction data vectors corresponding to a plurality of correction data units based on a plurality of original data packets of a data stream to be transmitted from a transmitter to a receiver over a communication channel and initialize a plurality of non-recovery probabilities, wherein each non-recovery probability is associated with a corresponding correction data vector selected from the first plurality of correction data vectors. The system is also configured to determine a second plurality of correction data vectors from the first plurality of correction data vectors, where the second plurality of correction data vectors contribute towards a non-recovery probability of a particular original data packet selected from the plurality of original data packets, minimize the non-recovery probability of the particular original data packet based on the determined second plurality of correction data vectors, and select a correction data vector from the second plurality of correction data vectors having a least value relative to the second plurality of correction data vectors. The system is also configured to transmit original data packets and correction data units corresponding to the selected correction data vector.

In another embodiment of the system, a correction data vector selected from the plurality of correction data vectors is defined by a predetermined number of original data packets selected from the plurality of original data packets and a predetermined number of correction data units selected from the plurality of correction data units.

In a further embodiment of the system, a loss probability selected from the plurality of non-recovery probabilities is determined based on a steady state probability of a first original data packet being successfully transmitted.

In yet another embodiment of the system, the system is further configured to determine the non-recovery probability based on a first transition probability corresponding to a successful transmission of an original data packet selected from the plurality of original data packets and on a second transition probability corresponding to a successful transmission of a correction data unit selected from the plurality of correction data units.

In yet a further embodiment of the system, a correction data vector of the first plurality of correction data vectors is determined to contribute to the non-recovery probability of the particular original data packet where the particular original data packet is identified as being lost and the corresponding correction data unit is identified as being lost.

In another embodiment of the system, the system is further configured to update the plurality of loss probabilities based on at least one most recent original data packet and on at least one most recent correction data unit transmitted from the transmitter to the receiver.

In a further embodiment of the system, the system is configured to update the plurality of non-recovery probabilities by associating a transition probability with a first correction data vector, wherein the first correction data vector corresponds to a non-recovery probability selected from the plurality of non-recovery probabilities, determining a second correction data vector based on the first correction data vector, and determining a non-recovery probability for the second correction data vector based on the transition probability of the first correction data vector and the non-recovery probability corresponding to the first correction data vector.

This disclosure also describes a system for transmitting a data stream over a communication channel, where the system comprises means for determining a first plurality of correction data vectors corresponding to a plurality of correction data units based on a plurality of original data packets of a data stream to be transmitted from a transmitter to a receiver over a communication channel and means for initializing a plurality of non-recovery probabilities, wherein each non-recovery probability is associated with a corresponding correction data vector selected from the first plurality of correction data vectors. The system also includes means for determining a second plurality of correction data vectors from the first plurality of correction data vectors, where the second plurality of correction data vectors contribute towards a non-recovery probability of a particular original data packet selected from the plurality of original data packets and means for minimizing the non-recovery probability of the particular original data packet based on the determined second plurality of correction data vectors. The system further includes means for selecting a correction data vector from the second plurality of correction data vectors having a least value relative to the second plurality of correction data vectors, and means for transmitting original data packets and correction data units corresponding to the selected correction data vector.

In another embodiment of the system, a correction data vector selected from the plurality of correction data vectors is defined by a predetermined number of original data packets selected from the plurality of original data packets and a predetermined number of correction data units selected from the plurality of correction data units.

In a further embodiment of the system, a loss probability selected from the plurality of non-recovery probabilities is determined based on a steady state probability of a first original data packet being successfully transmitted.

In yet another embodiment of the system, the non-recovery probability is further determined based on a first transition probability corresponding to a successful transmission of an original data packet selected from the plurality of original data packets and on a second transition probability corresponding to a successful transmission of a correction data unit selected from the plurality of correction data units.

In yet a further embodiment of the system, a correction data vector of the first plurality of correction data vectors is determined to contribute to the non-recovery probability of the particular original data packet where the particular original data packet is identified as being lost and the corresponding correction data unit is identified as being lost.

In another embodiment of the system, the system includes means for updating the plurality of loss probabilities based on at least one most recent original data packet and on at least one most recent correction data unit transmitted from the transmitter to the receiver.

With the Reed-Solomon codes of the prior art, the optimal codes are defined for a limited number of combinations of FEC overhead and FEC depth requirements, such that there is little flexibility to adapt to changes to these coding requirements beyond the defined combinations. Furthermore, the Reed-Solomon codes provide little flexibility to be extended to source-dependent FEC. With the trained systems of the prior art the optimization window makes it impossible for such methods to adapt quickly to changing channel conditions and FEC overhead and FEC depth requirements. These problems can be overcome with methods described herein.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

For a better understanding of the described embodiments and to show how the same may be put into effect, reference will now be made, by way of example, to the following drawings in which:

FIG. 8 illustrates an example of how loss-vector probabilities may be updated.

DETAILED DESCRIPTION

Figure 2:
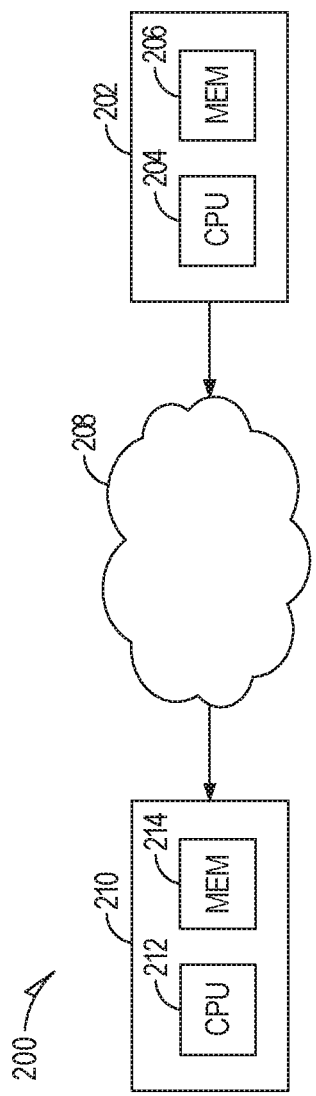
FIG. 2 shows a communication system according to an embodiment.

With reference to FIG. 2 there is now described a communication system 200. The communication system 200 comprises a transmitter 202, a network 208 and a receiver 210. The transmitter 202 comprises a processor 204 for processing data and a memory 206 for storing data. Similarly, the receiver 210 comprises a processor 212 for processing data and a memory 214 for storing data.

In operation the transmitter can process data (e.g. retrieved from the memory 206) to form a data stream comprising a plurality of data packets (e.g. using the processor 204). This processing may involve encoding the data for transmission according to any known protocol. Methods for encoding and packetizing data into a data stream are known in the art, and as such are not described in detail herein. The data stream can then be transmitted over a communication channel through the network 208 to the receiver 210. Methods for transmitting a data stream over a communication channel through a network are known in the art, and as such are not described in detail herein. The receiver 210 can then process the received data packets (e.g. using the processor 212) to retrieve the data. This processing may involve depacketizing and decoding the data from the data stream. The data may be stored in the memory 214 at the receiver, or output from the receiver 210, e.g. to a user. The data in the data stream may relate to a real-time communication event (such as a voice call or a video call) between a user of the transmitter 202 and a user of the receiver 210. Alternatively, the data in the data stream may relate to a data transfer such as a file transfer between the transmitter 202 and the receiver 210. The data in the data stream may be any other suitable type of data.

The network 208 may be any suitable network which has the ability to provide a communication channel between the transmitter 202 and the receiver 210. The network 208 could be a Wide Area Network (WAN) or a Local Area Network (LAN). As examples, the network 208 may be an intranet, the internet or a telephony network such as a mobile telephone network. The transmitter 202 and receiver 210 may be implemented in any suitable apparatus or device for transmitting and receiving a data stream over the network 208 respectively. For example, the transmitter 202 and receiver 210 may be implemented as user devices such as personal computers or telephones which have the ability to connect to the network 208, or as other devices such as server nodes in a network.

Figure 3:
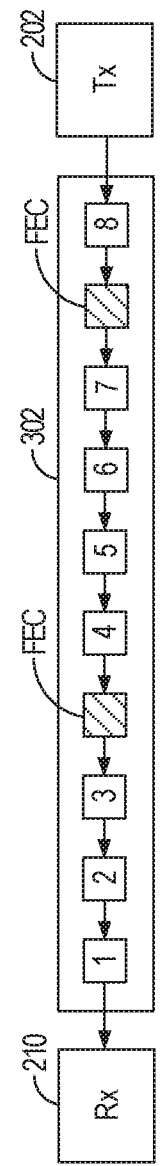
FIG. 3 is a representation of a data stream being transmitted in a communication system according to an embodiment.

FIG. 3 shows a representation of a data stream 302 being transmitted in the communication system 200 from the transmitter 202 to the receiver 210. The data stream 302 includes eight data packets labelled 1 to 8 in FIG. 3. Only eight data packets are shown in FIG. 3 for clarity but the data stream may include many more than eight data packets. As shown in FIG. 3, the data stream also includes FEC data units (labelled "FEC"). In FIG. 3 the FEC data units are shown as separate packets to the data packets in the data stream. However, the FEC data units may be appended (or "piggybacked") to the data packets. When the FEC data units are appended to the data packets the FEC data units do not require their own packet formatting, such as packet headers, and as such the amount of data in the data stream required for the FEC data units may be slightly reduced. However, appending the FEC data units to the data packets means that if a data packet is lost then so is the FEC data unit appended to that lost data packet. A FEC data unit appended to a data packet protects other data packets than the data packet to which it is appended.

Figure 1C:
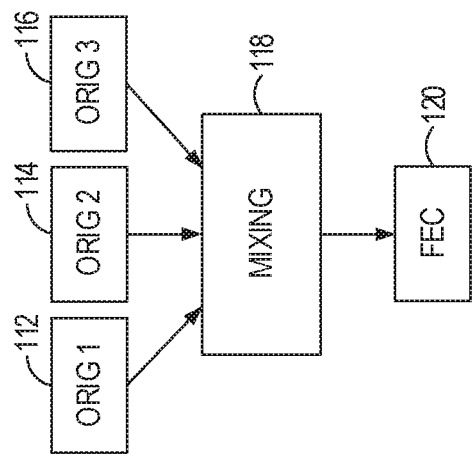
FIG. 1c illustrates a third example of how a FEC data unit may be generated.
Figure 1B:
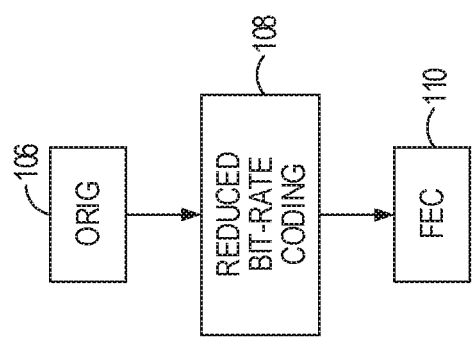
FIG. 1b illustrates a second example of how a FEC data unit may be generated.
Figure 1A:
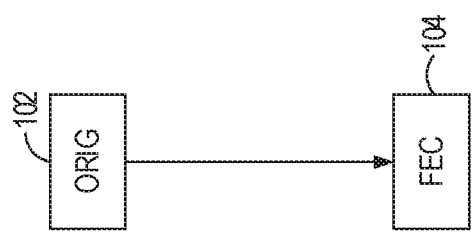
FIG. 1a illustrates a first example of how a FEC data unit may be generated.

As described above (e.g. in relation to FIGS. 1a to 1c), the FEC data units are generated based on a set of the data packets of the data stream. The set may include one or more data packet. A FEC data unit may, for example, be an exact cop) of an original data packet (as illustrated in FIG. 1a), or a copy of an original data packet encoded at a lower bit rate (as illustrated in FIG. 1b), or a combination/mixing of original data packets (as illustrated in FIG. 1c). Finite field (Galois field) arithmetic may be used to combine original data packets. In one approach, data packets are combined bit-by-bit using a bitwise XOR operation defined as (0 XOR 0)=(1 XOR 1)=0 and (0 XOR 1)=(1 XOR 0)=1. In another approach, data packets are combined byte-by-byte using Galois field $GF(2^8)$ arithmetic. Using these approaches, FEC data units may be generated by combining two or more of the data packets.

The communication channel through the network 208 is lossy, meaning that some of the data packets in the data stream will be lost during transmission from the transmitter 202 to the receiver 210. The FEC data units can be used at the receiver 210 to recover data packets which are lost during transmission. The term "lost data packets" includes data packets which are corrupted beyond repair during transmission as well as data packets which are lost during transmission.

As described above the scheme for generating the FEC data units sets the number of FEC data units to be generated and determines which of the data packets to use when generating the FEC data units. The loss-recovery performance of a FEC scheme describes the extent to which lost data packets can be recovered at the receiver using the FEC data units. The loss-recovery performance of a FEC scheme largely depends on the FEC overhead and FEC depth used in the FEC scheme.

FEC overhead describes the amount of redundant data relative to the amount of original data (e.g., the number of FEC packets relative to the number of original packets). Higher overhead generally improves the loss-recovery performance of a FEC scheme. On the other hand, higher overhead comes at a cost of bit rate efficiency. If the coding bit rate of original data is kept unchanged, then increased redundancy leads to increased total bit rate. Alternatively, if the total bit rate is constrained, then increased redundancy comes at a price of reduced coding bit rate of original data. As an example, for the FEC scheme which was used to generate the data stream 302 shown in FIG. 3, the FEC overhead was 25%. That is because there are eight data packets and two FEC packets. For this calculation, it is assumed that the amount of data in the FEC packets is the same as that in the data packets themselves.

FEC depth describes the displacement between the oldest and the newest of the data packets (including both of those data packets) that can be protected by (i.e. combined into) a FEC data unit. In other words, it describes the maximum number of original data packets that can be combined into a FEC data unit. Higher depth provides more possibilities of different combinations of data packets for the FEC data units, thus achieving higher flexibility of a FEC scheme, for example, to varying channel conditions. In one extreme example, where a FEC data unit is constrained to be a copy of one original data packet, higher depth provides a possibility for larger separation of the original data packet and its copy (the FEC data unit) in time. This is useful in bursty packet-loss conditions, since it minimizes the probability of both the original data packet and the copy (the FEC data unit) being lost in a burst on the communication channel. As an example, if the FEC depth of the FEC scheme used to generate the data stream 302 shown in FIG. 3 is five then the FEC packet shown between data packets 7 and 8 could be based on any one or more of the data packets labelled 3, 4, 5, 6 and 7.

Figure 4:
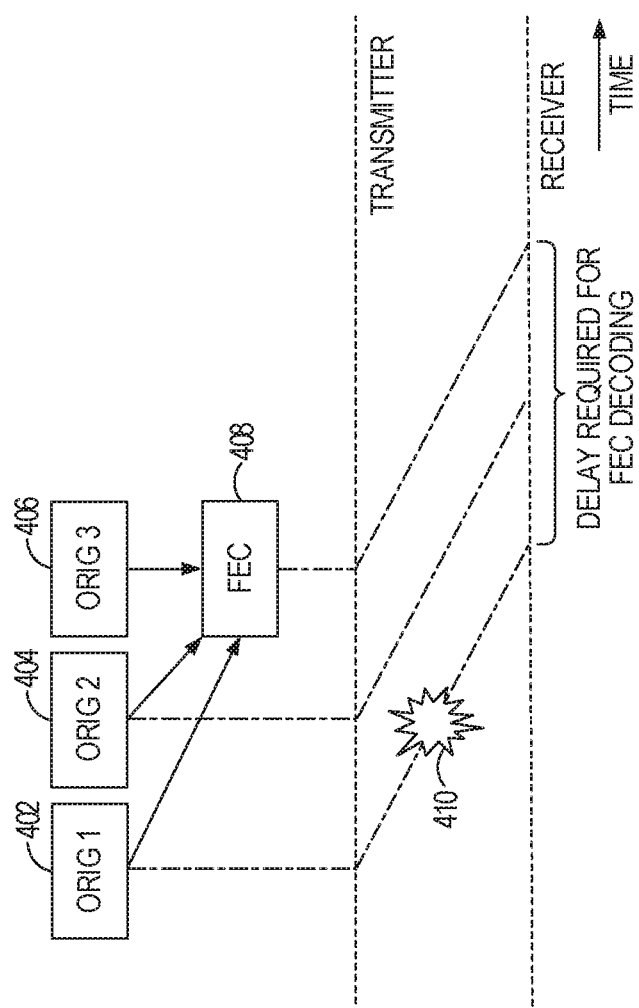
FIG. 4 is a timing diagram showing the transmission of data packets in a communication system according to an embodiment;\

The FEC depth is related to delay in the transmission. A FEC data unit combines previously-generated original data packets, and therefore there is no additional algorithmic delay at the transmitter 202 caused by using FEC. However, in order to reconstruct a lost data packet at the receiver 210, we assume a delay at the receiver 210, since the FEC data unit is generated and transmitted later than the data packets on which it is based. This can be seen in the timing diagram shown in FIG. 4. FIG. 4 shows a situation in which three of the data packets (402, 404 and 406) of the data stream are used to generate the FEC data unit 408. The FEC data unit cannot be generated until all three of the data packets 402, 404 and 406 have been generated. Therefore, the data packets 402 and 404 will be transmitted from the transmitter 202 before the FEC data unit 408 is generated at the transmitter 202. Therefore, the earliest that the FEC data unit 408 can be transmitted is straight after the data packet 406. This scenario is shown in FIG. 4. The transmission of the data packets and the FEC data unit takes some finite amount of time. FIG. 4 depicts the loss (410) of the data packet 402 during the transmission over the lossy communication channel through the network 208. However, the data packets 404 and 406 and the FEC data unit 408 are all successfully received at the receiver 210. The data packets 404 and 406 and the FEC data unit 408 can be used to recover the lost data packet 402 at the receiver 210. However, the lost data packet 402 cannot be recovered until all three of: the data packets 404 and 406 and FEC data unit 408 have been received at the receiver 210. Therefore, as shown in FIG. 4, there is a delay required for FEC recovery of the data packet 402 between the time when the data packet 402 should have been received at the receiver 210 (if it had not been lost) and the time at which the data packet can be recovered using the FEC data unit 408. This delay may be detrimental if the data in the data stream is to be output from the receiver 210 in real-time as it is received, e.g. in a voice call or a video call. In other embodiments, e.g. when the data is to be stored in the memory 214 at the receiver 210, for example, when the data stream relates to a file transfer between the transmitter 202 and the receiver 210, then the delay may not be so detrimental. Therefore, different types of data stream may have different delay requirements, which define the maximum delay that is acceptable before recovering a lost data packet. If the delay requirement for the data stream is not satisfied, the lost data packet 402 will be declared as not decodable at the receiver 210 prior to the arrival of the FEC data unit 408. This will most likely cause the performance of the FEC scheme to drop significantly.

However, this delay need not be necessarily introduced at the receiver by FEC as an additional delay. For example, the required delay may already exist at the receiver 210. One possible cause of delay at the receiver 210 is the presence of a jitter buffer. A jitter buffer introduces a delay into the data stream in order to mitigate random variations in packet arrival times (jitter). If the FEC data unit 408 is received before the time at which the data packet 402 was due to be output from the jitter buffer (had it not been lost during transmission) then it may be possible to recover the data packet 402 without introducing any extra delay at the receiver 210 over and above the delay already introduced by the jitter buffer. The FEC depth should be chosen so as to keep the delay between a lost data packet and a FEC data unit which can be used to recover the lost data packet within the delay requirements at the receiver 210. Therefore, for real-time data transmission (e.g. a voice call or a video call) the FEC depth may be set to a relatively low number, whereas for a data transfer such as a file transfer between the transmitter 202 and the receiver 210 the FEC depth may be set to a relatively high number to better cope with bursty loss conditions on the communication channel.

Figure 5:
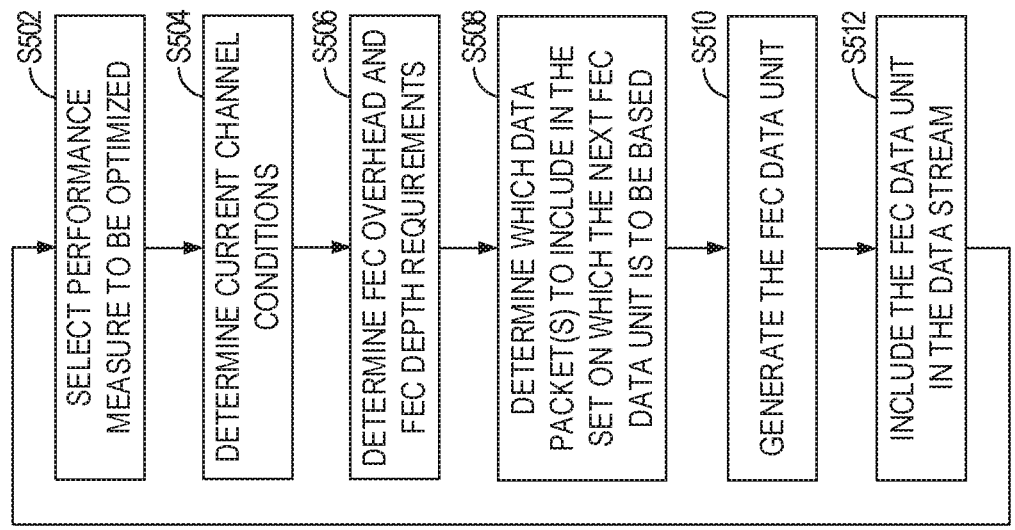
FIG. 5 is a flow chart for a process of generating correction data units according to an embodiment.
Figure 6:
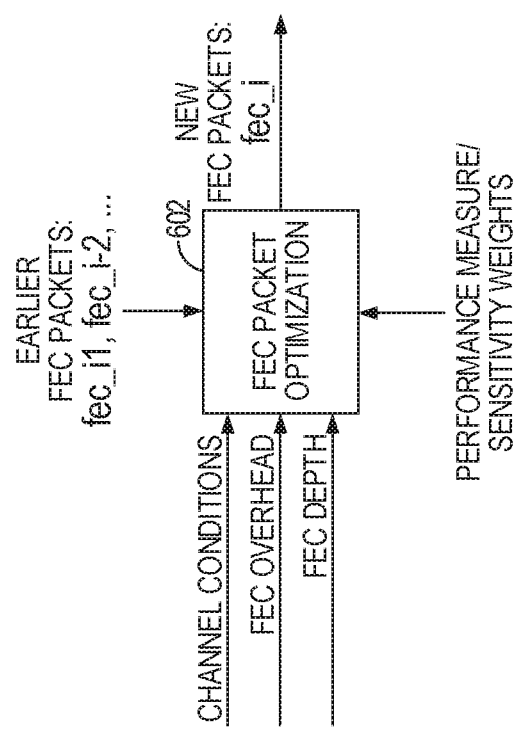
FIG. 6 is a schematic diagram showing a functional module for generating correction data units according to an embodiment.

With reference to FIGS. 5 and 6 there is now described a method of generating the FEC data units.

In step S502 a performance measure is selected to be optimized. The performance measure is a measure of the loss-recovery performance of the FEC scheme. Examples of loss-recovery performance measures are:

(i) the number of losses that can be recovered;
(ii) the sum $\Sigma p_i$, where $p_i$ is the non-recovery probability of the ith data packet. The sum includes original data packets within an optimization window;
(iii) the sum $\Sigma \Delta p_i$, where $\Delta p_i$ is a change in the non-recovery probability of the ith data packet due to the ability to recover the ith data packet;
(iv) the sum $\Sigma (p_i)^2$. Again, the sum includes original data packets within an optimization window. Squaring the non-recovery probabilities punishes higher non-recovery probabilities (i.e. outliers) more heavily; (v) the sum $\Sigma w_i p_i$, where $w_i$ is a weight applied to the non-recovery probability of the ith data packet;
(vi) the sum $\Sigma w_i \Delta p_i$;
(vii) the sum $\Sigma w_i p_i + \lambda r$, where r is a cost associated with the FEC data unit (e.g. FEC packet insertion flag or FEC data unit size) and $\lambda$ is a weighting factor (a constant) used to balance recovery and cost; and
(viii) the sum $\Sigma w_i \Delta p_i - \lambda r$.

In the loss-recovery performance measures (v)-(viii), the weights describe different levels of importance or sensitivity to loss of different data packets. Again, the sum includes original data packets within an optimization window. FEC schemes that use such a weighted performance measure are referred to as source-dependent sFEC or uneven-error-protection FEC, because the protection provided to different data packets is different. This allows a greater level of protection to be provided for more important data packets of the data stream (e.g. data packets from a particular application or user or data packets having greater importance, e.g. different audio data packets and different video data packets may have different levels of protection provided to them by the FEC scheme). In this way the data packets can have different levels of priority in the FEC scheme.

In a simple case where the costs of all FEC data units are deemed identical, a value of r=1 in loss-recovery performance measures (vii) and (viii) may be used when an FEC data unit is to be inserted in the data stream and a value of r=0 in loss-recovery performance measures (vii) and (viii) may be used when an FEC data unit is not inserted in the data stream (i.e. r represents a FEC packet insertion flag).

Alternatively, in loss-recovery performance measures (vii) and (viii) the cost r may be represented in terms of FEC data unit size (i.e. number of bits in a FEC data unit). That is, in the simple case where all of the FEC data units are of the same size, when an FEC data unit is to be inserted in the data stream, r may equal a constant value (number of bits)

and a value of r=0 in loss-recovery performance measures (vii) and (viii) may be used when an FEC data unit is not inserted in the data stream.

In the case where the FEC data unit size varies (i.e. the number of bits in the FEC data units are not the same) in loss-recovery performance measures (vii) and (viii) r may equal the number of bits in the FEC data unit and a value of r=0 in loss-recovery performance measures (vii) and (viii) may be used when an FEC data unit is not inserted in the data stream.

The optimization window may be a length of time or a number of data packets in the data stream over which the sums described above are calculated.

In step S504 the current conditions on the communication channel are determined. This step could comprise determining one or more of: (i) a current loss probability of data packets transmitted over the communication channel; (ii) a current measure of the loss burstiness of data packets transmitted over the communication channel; (iii) a current congestion on the communication channel; and (iv) the interference experienced on the communication channel. The most suitable FEC scheme depends upon the current channel conditions of the communication channel.

In step S506 the FEC overhead and the FEC depth requirements are determined. As described above, these coding requirements for the generation of the FEC data units are determined according to the desired attributes of the FEC scheme. For example, if the data stream is a real-time communication data stream the FEC depth is reduced relative to when the data stream is a file transfer. As another example, the FEC overhead may be reduced if the bit rate efficiency of the data stream is more important than the loss-recovery performance of the FEC scheme.

The selection of the performance measure in step S502 is used to determine which channel conditions are to be determined in step S504 (e.g. the conditions which are required to calculate the selected performance measure are determined). With knowledge of the performance measure selected in step S502 and the channel conditions determined in step S504, the FEC overhead and FEC depth can be determined in step S506 accordingly.

In step S508 it is determined which of the data packets of the data stream to include in the set of data packets on which the next FEC data unit is to be based. This step takes into account the determined current channel conditions (from step S504), the determined coding requirements, e.g. the FEC overhead and FEC depth requirements (from step S506), and the selection of the performance measure to be optimized (from step S502).

The determination in step S508 ensures that the FEC data units are generated within constraints of the coding requirements of the FEC scheme. The determination in step S508 takes account of the current channel conditions in order to optimize the performance measure which was selected in step S502. Where the selected performance measure is one of those marked above as (ii), (iv), (v) or (vii), optimizing the performance measure may involve minimizing the result of the respective sum. In this way the non-recovery probability sum that has been selected is minimized. If the selected performance measure is that marked (i) above then optimizing the performance measure may involve maximizing the number of losses that can be recovered. If the selected performance measure is that marked as (iii), (vi), or (viii) above then optimizing the performance measure may involve maximizing the result of the respective sum.

In optimizing the performance measure the step S508 also takes account of earlier FEC data units which have been generated and included in the data stream. By considering previously generated FEC units, the step S508 can determine the optimum gap between FEC data units and can also ensure that between the plurality of FEC data units which are generated a satisfactory protection (against loss) is provided to all of the data packets of the data stream. Some of the data packets may be protected by more than one FEC data unit. This means that the portions of the data stream covered by different FEC data units may overlap. In this way, FEC data units are selected for generation accounting for previously generated FEC data units that potentially already protect some of the data packets of the data stream to different degrees.

In step S510 the FEC data unit is generated based on the set of data packets that has been determined in step S508. In this way the generation of the FEC data unit is performed so as to optimize the performance measure selected in step S502 within the coding requirements determined in step S506.

Steps S508 and S510 are performed by the module 602 shown in FIG. 6. The module 602 may be a software module which is executed by the processor 204 at the transmitter 202. Alternatively, the module 602 may be a hardware module implemented at the transmitter 202. As illustrated in FIG. 6, the module 602 receives, as inputs, the channel conditions, the FEC overhead requirement, the FEC depth requirement, the selected performance measure and an indication of earlier FEC data units which have been generated. Based on these inputs, the module 602 generates the next FEC data unit and outputs the FEC data unit for inclusion in the data stream.

In step S512 the FEC data unit which is generated in step S510 is included in the data stream for transmission over the communication channel from the transmitter 202 to the receiver 210. As described above, the FEC data unit may be included as a separate packet in the data stream, or may be appended, or "piggybacked", to one of the data packets in the data stream. The data stream, including the FEC data unit is transmitted from the transmitter 202 to the receiver 210 over the communication channel. The data stream can be transmitted whilst the steps of the method shown in FIG. 5 are being performed for the next FEC data unit.

The method steps S502 to S512 shown in FIG. 5 are repeated for each FEC data unit. By performing the steps for each FEC data unit the generation of the FEC data units is adapted immediately to changing conditions, such as changing channel conditions on the communication channel, changing coding requirements and changes to the performance measure which is to be optimized. In this way the generation of the FEC data units can be adapted on-the-fly, i.e. dynamically adapted in real-time.

It can therefore be understood that for given channel conditions, FEC overhead, and FEC depth, the selection of optimal combinations/mixings of original data packets to form the FEC data units can be driven by optimizing the selected loss-recovery performance measure. Each FEC data unit is generated with a view to optimizing the performance measure based on the current channel conditions, FEC overhead and FEC depth, given the earlier FEC data units. That is, it is taken into account that some of the original data packets that can be protected by the new FEC data unit may have already been protected to a certain degree by earlier FEC data units.

By taking account of previous FEC data units, the level to which each data packet is already protected by previous FEC data units can be used to determine how to generate the next FEC data unit. In this way, the generation of the FEC data units can be controlled for each FEC data unit on-the-fly, but can also make sure that the group of generated FEC data units as a whole provide sufficient protection to all of the data packets of the data stream. As an example, if one of the data packets in the data stream is already protected by one or more previously generated FEC data units, then it may be determined that the next FEC data unit is not required to provide protection for that data packet. However, if for example, the current channel conditions are poor (e.g. there is a high packet loss on the communication channel) it may be determined that the next FEC data unit should protect a data packet even if that data packet has already been protected by a previously generated FEC data unit. These decisions can be made in real-time, on-the-fly, as each FEC data unit is generated. This allows the generation of the FEC data units to be optimized for each FEC data unit that is generated based on the previously generated FEC data units.

Optimization for each FEC data unit is performed on-the-fly. While providing a good performance, the proposed method offers high degree of flexibility to:
changing channel conditions;
changing FEC overhead requirements;
changing FEC depth requirements; and
changing distortion measures (e.g., changing sensitivity weights in source-dependent FEC).

Figure 7:
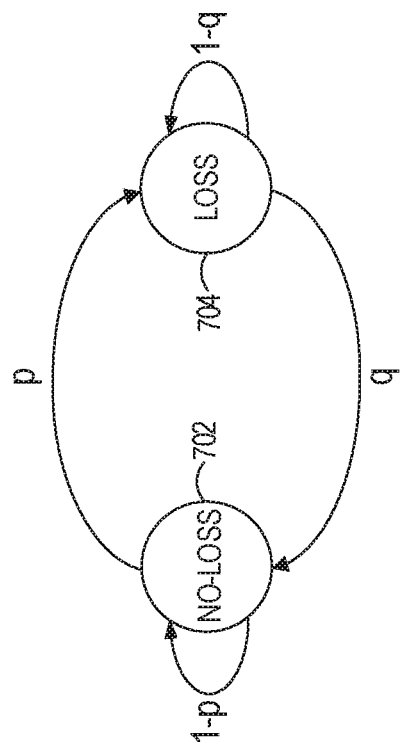
FIG. 7 is a schematic diagram representing a Gilbert model.

In one example, the channel conditions are described by a model. In one example, the model is a Gilbert model, as illustrated in FIG. 7. A Gilbert model is described by two states (packet loss 704 and no-loss 702) and by transition probabilities between the states defined by parameters p and q as shown in FIG. 7. The parameters p and q may be taken into account when determining how to optimize the FEC scheme. When packet loss is high on the communication channel (e.g. when p>q) then a greater number of FEC data units may be desirable to thereby maintain the loss-recovery performance at an acceptable level. In contrast, when packet loss is low on the communication channel (e.g. when p<q) then a lower number of FEC data units may be desirable to thereby improve the bit rate efficiency of the data stream.

In some embodiments the state-probabilities in the Gilbert model may be reset based on feedback information from the receiver 210. Feedback information in this context may indicate that a particular data packet has been successfully received or may indicate that the particular data packet was lost during transmission (or received too late to be considered as received successfully). The feedback information is transmitted from the receiver 210 to the transmitter 202 and as such the feedback information is available at the transmitter 202 after a time delay of approximately one Round Trip Time (RTT) on the communication channel. Therefore the feedback information received at the transmitter 202 relates to a point in the data stream that is approximately one RTT delayed compared to the current point in the data stream that the transmitter 202 is currently processing. Therefore, the Gilbert model is used, whereby the state probabilities are reset (i.e., the probability of one state is set to 0 and the other to 1 depending on the indication in the feedback information) for a time point t-RTT where t is the current point in time. The Gilbert model is then used to propagate the state probabilities from the time point t-RTT to the current time point t, in order to obtain a current estimate of the state probabilities (at time t). The estimated state probabilities at time t can be used in determining the current channel conditions on the communication channel, which in turn can be used in the generation of the FEC data units as described above.

Methods for computing an optimal FEC data unit are now described in more detail.

The methods described below use a notion of a "FEC vector" that indicates which original packets are mixed into a FEC data unit. An example of a FEC vector for an FEC scheme having a FEC depth of five is '00110', whereby the right-most position of the FEC vector corresponds to the most recently transmitted original data packet. A value of 1 in the FEC vector indicates that the associated original data packet is mixed into the FEC data unit and a value of 0 in the FEC vector indicates that the associated original data packet is not mixed into the FEC data unit. Referring back to FIG. 3, with an FEC depth of five and a FEC vector of '00110', this indicates that the FEC data unit shown between data packets 7 and 8 is based on the original data packets labelled 5 and 6. For a given FEC depth d, there are $2^d$ candidate FEC vectors.

The methods described below also use a notion of a "loss vector" that indicates which packets (original data packets and the FEC packet) are lost over the communication channel between the transmitter 202 and the receiver 210. As will be described in more detail below, a loss vector has an associated probability of occurring. An example of a loss vector for FEC depth five is '001000'. The right most-position of the loss vector corresponds to the FEC data unit. The remaining positions in the loss vector correspond to the original data packets, where the second position from the right corresponds to the most recently transmitted original data packet. A value of 1 in a loss vector indicates that the associated original data packet/FEC data unit was lost during transmission and was not received at the receiver 210, and a value of 0 in a loss vector indicates that the associated original data packet/FEC data unit was safely received at the receiver 210. Referring back to FIG. 3, with an FEC depth of five and a loss vector of '001000', this indicates the original data packet labelled 5 was lost during transmission and was not received at the receiver 210 whilst original data packets labelled 3, 4, 6 and 7 and the FEC data unit shown between data packets 7 and 8 were safely received at the receiver 210. For a given FEC depth d, there are $2^{d+1}$ possible loss vectors.

Two steps of the on-the-fly FEC process can be summarized as follows: 1) compute the best FEC vector, based on current loss-vector probabilities; and 2) update loss-vector probabilities, based on the Gilbert channel model (described above with reference to FIG. 7) and the latest inserted packet, where the latest packet can be an original data packet or the optimal FEC data unit.

A first method for computing $p_i$ in order to compute an optimal FEC data unit is now described.

As indicated above, the term $p_i$ needs to be computed when one of loss-recovery performance measures (ii), (iv), (v) or (vii) are selected at step S502.

As a mere example, at step S502 the loss-recovery performance measure (ii) sum $\Sigma p_i$, may be selected to be optimized. To minimize the result of this sum (the sum of non-recovery probabilities of original packets that can be protected by the current FEC data unit according to FEC depth d), $p_i$ needs to be computed for each candidate FEC vector.

To explain how $p_i$ is computed using the first method, reference is made to a simple example where two original data packets transmitted from the transmitter 202 to the receiver 210 can be protected by an FEC data unit (the FEC depth is two i.e. d=2). Thus there are four candidate FEC vectors and eight loss vectors. Below, candidate FEC vector '01' is used as an example, which indicates that the second original data packet is protected by the FEC data unit but the first original data packet is not protected by the FEC data unit. The possible loss vectors for this example FEC depth of 2 is shown below in Table 1.

TABLE 1

| Packet 1 | Packet 2 | FEC packet |
|----------|----------|------------|
| 0 | 0 | 0 |
| 0 | 0 | 1 |
| 0 | 1 | 0 |
| 0 | 1 | 1 |
| 1 | 0 | 0 |
| 1 | 0 | 1 |
| 1 | 1 | 0 |
| 1 | 1 | 1 |

Each of the loss vectors in Table 1 has an associated probability. The probability of the loss vectors in Table 1 is initialized according to the Gilbert model shown in FIG. 7. The probability of a loss vector is initialized by first considering the steady state probability of the successful transmission or loss of the first original data packet. The steady state probability of the first original data packet being successfully transmitted (the probability of being in the no-loss state 702 when the model is in steady state) is represented by $\pi_0$ where $$\pi_0 = \frac{q}{p+q}.$$

The steady state probability of the first original data packet being lost (the probability of being in the loss state 704 when the model is in steady state) is represented by $\pi_1$ where $$\pi_1 = \frac{p}{p+q}.$$

The initialized probability of a loss vector is then determined by multiplying this steady state probability with a first transition probability (following the successful transmission or loss of the second original data packet) and a second transition probability (following the successful transmission or loss of the FEC data unit). The initialized loss vector probabilities are shown below in Table 2.

TABLE 2

| Loss vector | Initial Probability |
|-------------|---------------------|
| 000 | $\pi_0 \times (1-p) \times (1-p)$ |
| 001 | $\pi_0 \times (1-p) \times (1-p)$ |
| 010 | $\pi_0 \times (p) \times (q)$ |
| 011 | $\pi_0 \times (p) \times (1-q)$ |
| 100 | $\pi_1 \times (q) \times (1-p)$ |
| 101 | $\pi_1 \times (q) \times (p)$ |
| 110 | $\pi_1 \times (1-q) \times (q)$ |
| 111 | $\pi_1 \times (1-q) \times (1-q)$ |

From the possible loss vectors shown in Table 1, for each original data packet, the loss vectors that contribute to the non-recovery probability of the respective original data packet are found.

Given candidate FEC vector '01', all loss vectors where the first original data packet is lost (where the loss vector has a value of 1 associated with packet 1) contribute to the non-recovery probability of the first original data packet because the first original data packet is not protected by the FEC data unit. The loss vectors where the second original data packet is lost (where the loss vector has a value of 1 associated with packet 2) and the FEC packet is also lost (where the loss vector has a value of 1 associated with the FEC data unit) contribute towards the non-recovery probability of the second original data packet. However, the loss vectors where the second original packet is lost but the FEC data unit is received (and thus the second original data packet is recovered) should not contribute to the non-recovery probability of the second original data packet.

Given candidate FEC vector '01', the loss vectors contributing to the non-recovery probability of the first original data packet are loss vectors 100, 101, 110, 111; and the loss vectors contributing to the non-recovery probability of the second original data packet are loss vectors 011, 111.

To compute a non-recovery probability $p_i$ of an original packet with index i, the probabilities of loss vectors that result in loss and non-recovery of the packet with index i are summed. Thus, in the present example the non-recovery probability of the first original data packet is:

$p_1 = 0 + p(100) + p(101) + p(110) + p(111)$

This involves the processor 204 performing four computations (additions) i.e. zero plus the probability of each of the loss vectors 100, 101, 110, 111. The non-recovery probability of the second original data packet is:

$p_2 = 0 + p(011) + p(111)$

This involves the processor 204 performing two computations (additions) i.e. zero plus the probability of each of the loss vectors 011, 111.

In order to obtain the loss-recovery performance measure (ii) sum $\Sigma p_i$, for the FEC vector '01' the non-recovery probability $p_1$ is added to the non-recovery probability $p_2$. This involves the processor 204 performing two computations (additions) i.e. zero plus the non-recovery probability $p_1$ plus the non-recovery probability $p_2$ Therefore in total, to obtain the loss-recovery performance measure (ii) sum $\Sigma p_i$, for the candidate FEC vector '01', the processor 204 performs eight computations.

As will be apparent to persons skilled in the art, in order to reduce the number of computations performed by the processor 204, the non-recovery probability of the first original data packet may be initialized with a probability associated with one of the loss vectors that contribute to the non-recovery probability of the first original data packet e.g. p(100) and then have only three computations (additions). Similarly, the non-recovery probability of the second original data packet may be initialized with a probability associated with one of the loss vectors that contribute to the non-recovery probability of the second original data packet e.g. p(011) and then have a single computation (addition). Furthermore the loss-recovery performance measure (ii) sum $\Sigma p_i$ may be obtained by adding the six probabilities of loss vectors that result in loss and non-recovery of the first and second original data packets, thus using five computations (additions) in total to obtain the loss-recovery performance measure (ii) sum $\Sigma p_i$, for the candidate FEC vector '01'.

As will be apparent given the example above, for the candidate FEC vector '00', the loss vectors contributing to the non-recovery probability of the first original data packet are loss vectors 100, 101, 110, and 111; and the loss vectors contributing to the non-recovery probability of the second original data packet are loss vectors 010, 011, 110, and 111.

Thus to obtain the non-recovery probability of the first original data packet, $p_1$, the processor 204 must perform three computations (additions) using the technique described above which minimizes the number of computations performed by processor 204 and to obtain the non-recovery probability of the second original data packet, $p_2$, the processor 204 must perform three computations (additions) using the technique described above which minimizes the number of computations performed by processor 204. Furthermore the loss-recovery performance measure (ii) sum $\Sigma p_i$ may be obtained by adding the eight probabilities of loss vectors that result in loss and non-recovery of the first and second original data packets, thus using seven computations (additions) in total to obtain the loss-recovery performance measure (ii) sum $\Sigma p_i$, for the candidate FEC vector '00'.

For the candidate FEC vector '10', the loss vectors contributing to the non-recovery probability of the first original data packet are loss vectors 101 and 111; and the loss vectors contributing to the non-recovery probability of the second original data packet are loss vectors 010, 011, 110, and 111. Thus to obtain the non-recovery probability of the first original data packet, $p_1$, (using the technique described above which minimizes the number of computations performed by processor 204) the processor 204 must perform a single computation (addition) and to obtain the non-recovery probability of the second original data packet, $p_2$, (using the technique described above which minimizes the number of computations performed by processor 204) the processor 204 must perform three computations (additions). Furthermore the loss-recovery performance measure (ii) sum $\Sigma p_i$ may be obtained by adding the six probabilities of loss vectors that result in loss and non-recovery of the first and second original data packets, thus using five computations (additions) in total to obtain the loss-recovery performance measure (ii) sum $\Sigma p_i$, for the candidate FEC vector '10'.

For the candidate FEC vector '11', the loss vectors contributing to the non-recovery probability of the first original data packet are loss vectors 101, 110 and 111; and the loss vectors contributing to the non-recovery probability of the second original data packet are loss vectors 011, 110, and 111. Thus to obtain the non-recovery probability of the first original data packet, $p_1$, (using the technique described above which minimizes the number of computations performed by processor 204) the processor 204 must perform two computations (additions) and to obtain the non-recovery probability of the second original data packet, $p_2$, (using the technique described above which minimizes the number of computations performed by processor 204) the processor 204 must perform two computations (additions). Furthermore the loss-recovery performance measure (ii) sum $\Sigma p_i$ may be obtained by adding the six probabilities of loss vectors that result in loss and non-recovery of the first and second original data packets, thus using five computations (additions) in total to obtain the loss-recovery performance measure (ii) sum $\Sigma p_i$, for the candidate FEC vector '10'.

To optimize the selected performance measure, (ii) sum $\Sigma p_i$, in this example, at step S508 referred to above, the candidate FEC vector which has the smallest value of the performance measure is selected (one of the FEC vectors '00', '01', '10', and '11'), and the selected FEC vector indicates which of the original data packets are to be included in the set on which the next FEC data unit is to be based.

It will be appreciated that for candidate FEC vector '00' when any of measures (ii), (iv), and (v) are selected to be optimized at step S502, the performance measure will always be the highest due to neither the first original data packet nor the second original data packet being protected by a FEC data unit i.e. a FEC data unit is not inserted. Thus the loss-recovery performance measure for the candidate FEC vector '00' will never have the smallest value. One way of handling the candidate FEC vector '00' is to compute a value for the selected performance measure ((ii), (iv), or (v)) but exclude it from selection when optimizing the selected performance measure. Another way of handling the candidate FEC vector '00' is to not compute a value for the selected performance measure ((ii), (iv), or (v)), this reduces the number of computations that the processor 204 must perform. Whilst this has been described with reference to a FEC depth of 2, it will be appreciated that the same principles apply for any candidate FEC vector in which no FEC data unit is inserted when higher FEC depths are used.

In contrast, when measure (vii) is selected to be optimized, it makes sense to compute a value for the loss-recovery performance measure for the candidate FEC vector '00' since in this measure recovery is balanced with a cost and the candidate FEC vector '00' doesn't cost anything (no FEC data unit is inserted).

As will be apparent from the above, to arrive at the loss-recovery performance measure (ii) sum $\Sigma p_i$, for all of the possible FEC vectors given FEC depth of 2 (when the loss-recovery performance measure is not computed for candidate FEC vector '00') the processor 204 performs a total of fifteen computations (additions).

Once the FEC data unit is generated based on the set of data packets that has been determined in step S508, the loss-vector probabilities are updated based on the Gilbert channel model and the latest inserted packet, where the latest packet can be an original data packet or the optimal FEC data unit. The updated loss-vector probabilities are then used in determining the best FEC vector for the next FEC data unit.

The update of the loss-vector probabilities is now described with reference to Table 3 shown below and FIG. 8; given selected FEC vector '01'.

Considering as an example the old loss vector '010' (the first original data packet and FEC data unit are received and the second original data packet is lost). Since the second original data packet is recovered, the loss vector is first converted to '000' (this is shown in the 'after recovery' column of Table 3). Next, the loss vector is updated by keeping the two most recent original data packets and substituting the FEC packet by a new packet (the new packet can be an original packet or an FEC packet). The new packet can be received (thus the new loss vector is '000') with probability 1−p (transition from 'no loss' to 'no loss' in the Gilbert model shown in FIG. 7), or lost (thus the new loss vector is '001') with probability p (transition from 'no loss' to 'loss' in the Gilbert model shown in FIG. 7). Therefore, the old loss vector '010' is updated to new loss vector '000' with probability 1−p and new loss vector '001' with probability p.

Table 3 shown below indicates how, given selected FEC vector '01' an old loss vector is updated to a new loss vector with an associated transition probability.

TABLE 3

| Old Loss Vector | After Recovery | New Loss Vector | Condition | Probability |
|---|---|---|---|---|
| 000 | N/A | 000 | new packet received | (1-p) |
|  |  | 001 | new packet lost | (p) |
| 001 | N/A | 000 | new packet received | (q) |
|  |  | 001 | new packet lost | (1-q) |
| 010 | 000 | 000 | new packet received | (1-p) |
|  |  | 001 | new packet lost | (p) |
| 011 | N/A | 010 | new packet received | (q) |
|  |  | 011 | new packet lost | (1-q) |
| 100 | N/A | 100 | new packet received | (1-p) |
|  |  | 101 | new packet lost | (p) |
| 101 | N/A | 100 | new packet received | (q) |
|  |  | 101 | new packet lost | (1-q) |
| 110 | 100 | 100 | new packet received | (1-p) |
|  |  | 101 | new packet lost | (p) |
| 111 | N/A | 110 | new packet received | (q) |
|  |  | 111 | new packet lost | (1-q) |

FIG. 8 illustrates Table 3 by showing the transition probabilities of each update from an old loss vector to a new loss vector.

From FIG. 8 and Table 3, the probabilities of old loss vectors (indicated below by p(xxx) where x=0 or 1) and transition probabilities (defined by p and q) which contribute to new loss vector probabilities (indicated below by p(xxx)' where x=0 or 1) given selected FEC vector '01' can be found, as indicated below.

$$p(000)'=[p(000)\times(1-p)]+[p(001)\times(q)]+[p(010)\times(1-p)]$$

$$p(001)'=[p(000)\times(p)]+[p(001)\times(1-q)]+[p(010)\times(p)]$$

$$p(010)'=p(011)\times(q)$$

$$p(011)'=p(011)\times(1-q)$$

$$p(100)=[p(100)\times(1-p)]+[p(101)\times(q)]+[p(110)\times(1-p)]$$

$$p(101)'=[p(100)\times(p)]+[p(101)\times(1-q)]+[p(110)\times(p)]$$

$$p(110)'=p(111)\times(q)$$

$$p(111)'=p(111)\times(1-q)$$

For example the probability of new loss vector 000, p(000)', equals the probability of the old loss vector 000, p(000), multiplied by the transition probability (1-p), plus the probability of the old loss vector 001, p(001), multiplied by the transition probability q, plus the probability of the old loss vector 010, p(010), multiplied by the transition probability (1-p).

For the next FEC data unit, the new loss vector probabilities are used in computing the non-recovery probability of the first original data packet, $p_1$, and the non-recovery probability of the second original data packet, $p_2$.

Whilst the update of the loss-vector probabilities has been described with reference to the selected FEC vector '01', it will be appreciated that the same principles apply for the other possible selected FEC vectors.

Whilst the first method for computing $p_i$ in order to compute an optimal FEC data unit has been described above with reference to optimizing the loss-recovery performance measure (ii) sum $\Sigma p_i$, the first method for computing $p_i$ may also be used for optimizing the loss-recovery performance measures (iv), (v) or (vii) described above.

The inventors have recognized that instead of computing a non-recovery probability of an original data packet by summing the probability of events where the packet is lost and not recovered, it is more computationally efficient to consider the events where packets are recovered rather than lost and not recovered because there are fewer events that lead to recovery compared to loss and non-recovery.

A second more computationally efficient method for computing $p_i$ in order to compute an optimal FEC data unit is now described. In this second method, for each FEC vector a non-recovery probability of an original data packet is determined by determining the probability of the original data packet being lost if no FEC data unit is protecting it and then subtracting the probability of the original data packet being recovered.

To explain how $p_i$ is computed in the second method, reference is again made to a simple example where two original data packets that are transmitted from the transmitter 202 to the receiver 210 can be protected by an FEC data unit (the FEC depth is two i.e. d=2).

The possible loss vectors for this example FEC depth of 2 is shown above in Table 1. For all candidate FEC vectors ('00', '01', '10', and '11'), the loss vectors for which the first original data packet is lost are 100, 101, 110, and 111, and the loss vectors for which the second original data packet is lost are 010, 011, 110 and 111.

In the second method, when computing the data packets to include in the set on which the next FEC data unit is to be based at step S508, the loss vectors in which the FEC data unit is lost are not considered in an initialization stage (the initialization stage comprising determining the probability of the original data packet being lost if no FEC data unit is protecting it). Loss vectors in which the FEC data unit is lost are not considered because when the FEC data unit is lost during the transmission over the communication channel from the transmitter 202 to the receiver 210, in calculating $p_i$ it does not matter what the FEC data unit was. By omitting loss vectors in which the FEC data unit is lost in the initialization stage, an approximation of $p_i$ is introduced.

The probability of the original data packet being lost if no FEC data unit is protecting it is the same for each candidate FEC vector, therefore this only needs to be computed once for each original data packet.

The probability of the first original data packet being lost if no FEC data unit is protecting it, $\acute{p}_1$=p(100)+p(110). Thus, the processor 204 must perform a single computation (addition) to make this determination (using the technique described above which minimizes the number of computations performed by processor 204). The probability of the second original data packet being lost if no FEC data unit is protecting it, $\acute{p}_2$=p(010)+p(110). Thus, the processor 204 must perform a single computation (addition) to make this determination (using the technique described above which minimizes the number of computations performed by processor 204).

For the candidate FEC vector '00', the first original data packet cannot be recovered for loss vector 100 or 110 and the second original data packet cannot be recovered for loss vector 010 or 110. Thus no subtraction of a probability of an original data packet being recovered is required. Therefore the non-recovery probability of the first original data packet, $p_1$=$\acute{p}_1$. Similarly the non-recovery probability of the second original data packet, $p_2$=$\acute{p}_2$. To obtain the loss-recovery performance measure (ii) sum $\Sigma p_i$, for the candidate FEC vector '00' the non-recovery probability $p_1$ is added to the non-recovery probability $p_2$, which involves the processor 204 performing a single computation (addition), using the technique described above which minimizes the number of computations performed by processor 204. Thus, in addition to the computations required to obtain $\acute{p}_1$ and $\acute{p}_2$, to obtain the loss-recovery performance measure (ii) sum $\Sigma p_i$, for the candidate FEC vector '00', the processor 204 performs a single computation (addition).

For the candidate FEC vector '01', the first original data packet cannot be recovered for loss vector 100 or 110 but the second original data packet can be recovered for loss vectors 010 and 110. Therefore the non-recovery probability of the first original data packet, $p_1=\acute{p}_1$. However, the non-recovery probability of the second original data packet, $p_2=\acute{p}_2-p(010)-p(110)$. The processor 204 must perform two computations (subtractions) to make the determination of $p_2$. To obtain the loss-recovery performance measure (ii) sum $\Sigma p_i$, for the candidate FEC vector '01' the non-recovery probability $p_1$ is added to the non-recovery probability $p_2$, which involves the processor 204 performing a single computation (addition), using the technique described above which minimizes the number of computations performed by processor 204. Thus, in addition to the computations required to obtain $\acute{p}_1$ and $\acute{p}_2$, to obtain the loss-recovery performance measure (ii) sum $\Sigma p_i$, for the candidate FEC vector '01', the processor 204 performs three computations (two subtractions and one addition).

For the candidate FEC vector '10', the second original data packet cannot be recovered for loss vectors 010 and 110, but the first original data packet can be recovered for loss vectors 100 and 110. Therefore the non-recovery probability of the second original data packet, $p_2=\acute{p}_2$, and the non-recovery probability of the first original data packet, $p_1=\acute{p}_1-p(100)-p(110)$. The processor 204 must perform two computations (subtractions) to make the determination of $p_1$. To obtain the loss-recovery performance measure (ii) sum $\Sigma p_i$, for the candidate FEC vector '10' the non-recovery probability $p_1$ is added to the non-recovery probability $p_2$, which involves the processor 204 performing a single computation (addition) using the technique described above which minimizes the number of computations performed by processor 204. Thus, in addition to the computations required to obtain $\acute{p}_1$ and $\acute{p}_2$, to obtain the loss-recovery performance measure (ii) sum $\Sigma p_i$, for the candidate FEC vector '10', the processor 204 performs three computations (two subtractions and one addition).

For the candidate FEC vector '11', the first original data packet can be recovered for loss vector 100 but cannot be recovered for loss vector 110. Therefore the non-recovery probability of the first original data packet, $p_1=\acute{p}_2-p(100)$. For FEC vector '11', the second original data packet can be recovered for loss vector 010 but cannot be recovered for loss vector 110. Therefore the non-recovery probability of the second original data packet, $p_2=\acute{p}_2-p(010)$. To obtain the loss-recovery performance measure (ii) sum $\Sigma p_i$, for the FEC vector '11' the non-recovery probability $p_1$ is added to the non-recovery probability $p_2$, which involves the processor 204 performing a single computation (addition). Thus, in addition to the computations required to obtain $\acute{p}_1$ and $\acute{p}_2$, to obtain the loss-recovery performance measure (ii) sum $\Sigma p_i$, for the candidate FEC vector '11', the processor 204 performs three computations (two subtractions and one addition).

To optimize the selected performance measure, (ii) sum $\Sigma p_i$, in this example, at step S508 referred to above, the candidate FEC vector which has the smallest value of the performance measure is selected (one of the FEC vectors '00', '01', '10', and '11'), and the selected FEC vector indicates which of the original data packets are to be included in the set on which the next FEC data unit is to be based.

In the second method for computing $p_i$ in order to compute an optimal FEC data unit described above, it will be appreciated that for candidate FEC vector '00', the performance measure will always be the highest due to neither the first original data packet nor the second original data packet being protected by a FEC data unit i.e. a FEC data unit is not inserted. Thus the loss-recovery performance measure for the candidate FEC vector '00' will never have the smallest value. In the second method, the candidate FEC vector '00' may be handled in the same manner as described above with reference to the first method for computing $p_i$. Similarly, when measure (vii) is selected to be optimized, it makes sense to compute a value for the loss-recovery performance measure for the candidate FEC vector '00' since in this measure recovery is balanced with a cost and the candidate FEC vector '00' doesn't cost anything (no FEC data unit is inserted).

As will be apparent from the above, to arrive at the loss-recovery performance measure (ii) sum $\Sigma p_i$, for all of the possible candidate FEC vectors given FEC depth of 2 (when the loss-recovery performance measure is not computed for candidate FEC vector '00') the processor 204 performs a total of eleven computations (additions/subtractions) using the second method for computing $p_i$. Thus it will be apparent that the second method is more computationally efficient compared to the first method (which requires the processor 204 to perform a total of fifteen computations to arrive at the loss-recovery performance measure (ii) sum $\Sigma p_i$, for all of the possible candidate FEC vectors given FEC depth of 2).

Whilst the increase in computational efficiency has been described above with reference to a FEC depth of 2, the increase in computational efficiency is also achieved for any FEC depth greater than 2.

Whilst the second method for computing $p_i$ in order to compute an optimal FEC data unit has been described above with reference to optimizing the loss-recovery performance measure (ii) sum $\Sigma p_i$, the second method may also be used for optimizing the loss-recovery performance measures (v) and (vii) described above.

The second method for computing $p_i$ in order to compute an optimal FEC data unit described above cannot be used for the loss-recovery performance measure (iv) due to the exclusion of some loss events (those where the FEC data unit is lost) from computing the probabilities.

The second method for computing $p_i$ in order to compute an optimal FEC data unit described above can be used for loss-recovery performance measure (ii), (v) and (vii) because it has the same effect on all probabilities and candidates, since the effect is linear (relative performance of candidate FEC vectors won't change). However, when loss-recovery performance measure (iii) is used, the effect is non-linear (square), and therefore removing some loss vectors from probability calculations may change relative performance of candidate FEC vectors.

In the second method for computing $p_i$ in order to compute an optimal FEC data unit described above, the loss vectors in which the FEC data unit is lost may be included in the initialization stage (therefore loss-recovery performance measure (iii) may be used), however this increases the number of required computations that must be performed by the processor 204 and therefore decreases computational efficiency.

In the second method, the initialization and update of loss vector probabilities is implemented in the same manner as that described above with reference to the less computationally efficient first method.

A method for computing $\Delta p_i$ in order to compute an optimal FEC data unit is now described.

The method for computing $\Delta p_i$ described herein, like the second method, is based on the principle that it is more computationally efficient to consider the events where packets are recovered rather than lost and not recovered because there are fewer events that lead to recovery compared to loss and non-recovery.

As indicated above, the term $\Delta p_i$ needs to be computed when one of loss-recovery performance measures (iii), (vi), (viii) are selected at step S502. As a mere example, at step S502 the loss-recovery performance measure (iii) $\Sigma \Delta p_i$ sum, may be selected to be optimized.

To explain how $\Delta p_i$ is computed, reference is again made to a simple example where two original data packets that are transmitted from the transmitter 202 to the receiver 210 can be protected by an FEC data unit (the FEC depth is two i.e. d=2).

For each candidate FEC vector ('00', '01', '10', and '11'), it is determined for each loss vector whether an original data packet can be recovered if lost during transmission from the transmitter 202 to the receiver 210. For each candidate FEC vector the probability of loss vectors in which an original data packet can be recovered if lost during transmission from the transmitter 202 to the receiver 210 are summed to compute a value of $\Sigma \Delta p_i$.

For the candidate FEC vector '00', the first original data packet cannot be recovered for loss vector 100 or 110 and the second original data packet cannot be recovered for loss vector 010 or 110. Therefore a value of $\Sigma \Delta p_i$ is set to zero for the candidate FEC vector '00'.

For the candidate FEC vector '01', the first original data packet cannot be recovered for loss vector 100 or 110 but the second original data packet can be recovered for loss vectors 010 and 110. Thus $\Sigma \Delta p_i = p(010) + p(110)$, whereby the processor 204 must perform a single computation (addition), using the technique described above which minimizes the number of computations performed by processor 204, to make the determination of $\Sigma \Delta p_i$ for the candidate FEC vector '01'.

For the candidate FEC vector '10', the second original data packet cannot be recovered for loss vectors 010 and 110, but the first original data packet can be recovered for loss vectors 100 and 110. Thus $\Sigma \Delta p_i = p(100) + p(110)$, whereby the processor 204 must perform a single computation (addition), using the technique described above which minimizes the number of computations performed by processor 204, to make the determination of $\Sigma \Delta p_i$ for the candidate FEC vector '10'.

For the candidate FEC vector '11', the first original data packet can be recovered for loss vector 100 but cannot be recovered for loss vector 110, and the second original data packet can be recovered for loss vector 010 but cannot be recovered for loss vector 110. Thus $\Sigma \Delta p_i = p(100) + p(010)$, whereby the processor 204 must perform a single computation (addition), using the technique described above which minimizes the number of computations performed by processor 204, to make the determination of $\Sigma \Delta p_i$ for the candidate FEC vector '11'.

To optimize the selected loss-recovery performance measure, (iii) $\Sigma \Delta p_i$ at step S508 referred to above, the candidate FEC vector which has the highest value of the performance measure is selected (one of the FEC vectors '00', '01', '10', and '11'), and the selected FEC vector indicates which of the original data packets are to be included in the set on which the next FEC data unit is to be based.

As will be apparent from the above, to arrive at the loss-recovery performance measure (iii) sum $\Sigma \Delta p_i$, for all of the possible FEC vectors given FEC depth of 2 the processor 204 performs a total of three computations (additions). Thus it will be apparent that it is more computationally efficient to compute $\Delta p_i$ compared to computing $p_i$ (using either the first or second method).

In the method described above for computing $\Delta p_i$, the initialization and update of loss vector probabilities is implemented in the same manner as that described above with reference to the first method for computing $p_i$.

In one example, more than one FEC data unit may be designed at a time. In this case, a small number of FEC packets are optimized jointly. This example acts as a trade-off between on-the-fly determination of the FEC data units and setting the FEC scheme for a plurality of FEC data units simultaneously. Instead of taking a decision for the generation of a FEC data unit when it is due to be generated, the method may wait until it is time to generate the next FEC data unit, and then optimize the two data units jointly at the same time, while taking into account all of the previous FEC data units that protect data packets that can be protected by these two FEC data units. Waiting before generating a FEC data unit in this way may improve the recovery performance of the FEC scheme as the generation of the FEC data units can take into account more information. However, waiting in this way may increase the delay in generating the FEC data units. Therefore the decision as to whether to wait before generating a FEC data unit as described above is a trade-off between the delay and the improved recovery performance. This decision can be made on-the-fly. In this sense, a common performance measure is selected for the generation of a plurality of the FEC data units and a common coding requirement is determined for the generation of the plurality of FEC data units. Then for the generation of the plurality of FEC data units, it is determined jointly which of the data packets of the data stream to include in the respective sets on which the generation of each of the plurality of FEC data units is to be based to thereby optimize the selected common performance measure within the constraints of the determined common coding requirement and based on at least one previously generated FEC data unit.

In the embodiments described above, the correction scheme that is used is a FEC scheme. In other embodiments, other types of correction scheme may be used which generate correction data units which are not FEC data units.

A FEC scheme that transmits all of the original data and the redundant FEC data is called a systematic FEC scheme. A FEC scheme that does not transmit all of the original data is called a non-systematic scheme. In the latter case, the total amount of data in the transmitted data stream is still higher than the amount of original data in the data stream (prior to the generation of the FEC data), to thereby provide redundancy. For simplicity, but without loss of generality, the embodiments described herein relate to systematic FEC schemes, but it would be apparent to a person skilled in the art that the same principles could be applied to non-systematic schemes.

The method may comprise, for the generation of each of said correction data units, determining current channel conditions on the communication channel, wherein said step of determining which of the data packets of the data stream to include in said set for each of the correction data units is further based on the current channel conditions determined for the generation of that correction data unit. The current channel conditions may comprise at least one of: (i) a current loss probability of data packets transmitted over the communication channel; (ii) a current measure of the loss burstiness of data packets transmitted over the communication channel; (iii) a current congestion on the communication channel; and (iv) the interference experienced on the communication channel. The current channel conditions may be described by a Gilbert model and the method may further comprise: receiving feedback information from the receiver indicating which of the data packets of the data stream have been successfully received; resetting state probabilities of the Gilbert model based on the received feedback information; and propagating the state probabilities in time using the Gilbert model to obtain estimates of the state probabilities at the current time for use in determining the current channel conditions on the communication channel.

The coding requirement may be a current coding requirement for the generation of each of said correction data units. The coding requirement may comprise an overhead which sets the ratio between the amount of data in the correction data units included in the data stream and the amount of data in the data packets included in the data stream.

The coding requirement may comprise a depth which sets the maximum allowable displacement in the data stream between the oldest and the newest of the data packets that are allowed to be included within the same one of said sets on which the correction data units are based.

In embodiments in which the coding requirement comprises a depth, the selected performance measure may comprise one of: (i) the number of lost data packets that cannot be recovered; (ii) a sum of non-recovery probabilities of said data packets within an optimization window; (iii) a sum of changes in non-recovery probabilities of said data packets within an optimization window due to ability of one or more packets of said data packets to be recovered at the receiver if lost during transmission from said transmitter to said receiver; (iv) a sum of squared non-recovery probabilities of said data packets within an optimization window; (v) a sum of weighted non-recovery probabilities of said data packets within an optimization window, wherein the non-recovery probabilities are weighted to provide different loss sensitivities for different data packets; (vi) a sum of weighted changes in non-recovery probabilities of said data packets within an optimization window due to ability of one or more packets of said data packets to be recovered at the receiver if lost during transmission from said transmitter to said receiver; (vii) a sum of weighted non-recovery probabilities of said data packets within an optimization window, wherein the non-recovery probabilities are weighted to provide different loss sensitivities for different data packets, added to a cost associated with the correction data unit; and (viii) a cost associated with the correction data unit subtracted from a sum of weighted changes in non-recovery probabilities of said data packets within an optimization window due to ability of one or more packets of said data packets to be recovered at the receiver if lost during transmission from said transmitter to said receiver, wherein the changes in non-recovery probabilities are weighted to provide different loss sensitivities for different data packets In an embodiment, wherein the selected performance measure comprises at least one of (ii), (iv), (v), and (vii), and the selected performance measure is optimized when it is minimized.

In an embodiment, wherein the selected performance measure comprises at least one of (i), (iii), (vi) and (viii) and the selected performance measure is optimized when it is maximized.

Given a particular depth there is a predefined number of possible events arising from the possibility of each of the data packets of the data stream that may be used in the set of data packets on which the generation of the correction data unit is to be based and the correction data unit to be generated being successfully transmitted from the transmitter to the receiver or lost over the lossy communication channel, each possible event having an associated probability.

The selected performance measure may comprise one of (ii), (iv), (v), and (vii), and the non-recovery probability of a data packet may be computed by summing the probability of events where said data packet is lost and not recovered.

The selected performance measure may comprise one of (ii), (iv), (v), and (vii), and the non-recovery probability of a data packet may be computed by summing the probability of events where said data packet is lost and not recovered if no correction data unit is based on said data packet, and subtracting, from said sum, the probability of the events where said data packet is recovered due to the correction data unit to be generated being based on said data packet.

The selected performance measure may comprise one of (iii), (vi) and (viii), and the changes in non-recovery probabilities of said data packets may be computed by summing probabilities of events where one or more of said data packets can be recovered by the correction data unit to be generated.

The probability associated with a possible event may be initialized based on a steady state probability of a Gilbert model and transition probabilities between states of the Gilbert model.

The probability associated with a possible event may be updated after each correction data unit is included in the data stream.

Given a particular depth there is a predefined number of possible configurations of which of the data packets of the data stream may be included in the set on which the generation of the correction data unit is to be based, the method comprising computing the selected performance measure for each possible configuration.

The generated correction data units may be included in the data stream as separate packets to the data packets of the data stream. Alternatively, the step of including the generated correction data units in the data stream may comprise appending the correction data units to at least some of the data packets of the data stream.

In embodiments, the correction data units are forward error correction data units.

According to a second aspect of the invention there is provided an apparatus for generating correction data units relating to a plurality of data packets of a data stream, each correction data unit being based on a set of the data packets of the data stream, said data stream being for transmission from a transmitter to a receiver over a lossy communication channel, the apparatus comprising: selection means for selecting, for the generation of each of said correction data units, based on the data stream, a performance measure to be optimized, said performance measure relating to the recovery of lost data packets of the data stream; coding requirement determining means for determining a coding requirement for the generation of each of said correction data units; data packet determining means for determining, for the generation of each of said correction data units, within the constraints of said determined coding requirement and based on at least one previously generated correction data unit, which of the data packets of the data stream to include in the set on which the generation of the correction data unit is to be based to thereby optimize the selected performance measure; channel condition determining means for determining, for the generation of each of said correction data units, current channel conditions on the communication channel, wherein said data packet determining means is configured to determine which of the data packets of the data stream to include in the set for each of the correction data units based on the current channel conditions determined for the generation of that correction data unit; generating means for generating each of said correction data units based on the respective set of the data packets of the data stream; and including means for including the generated correction data units in the data stream.

According to a third aspect of the invention there is provided a computer program product for generating correction data units relating to a plurality of data packets of a data stream, each correction data unit being based on a set of the data packets of the data stream, said data stream being for transmission from a transmitter to a receiver over a lossy communication channel, and the computer program product being embodied on a non-transient computer-readable medium and configured so as when executed on a processor of the transmitter to perform the methods described herein.

The method steps shown in FIG. 5 and described herein may be implemented in hardware or in software at the transmitter 202. Furthermore, there may be provided a computer program product (e.g. for storage in the memory 206 of the transmitter 202) comprising instructions which when executed by computer processing means at the transmitter 202 will implement the methods described above. In particular, the processor 204 could implement each step in FIG. 5 at the transmitter 202.

The steps shown separately in FIG. 5 may or may not be implemented as separate steps. The terms "module" as used herein generally represent software, firmware, hardware, or a combination thereof. In the case of a software implementation, the module, functionality, or logic represents program code that performs specified tasks when executed on a processor (e.g. CPU or CPUs). The program code can be stored in one or more computer readable memory devices. The features of the techniques described herein are platform-independent, meaning that the techniques may be implemented on a variety of commercial computing platforms having a variety of processors. For example, the transmitter 202 may also include an entity (e.g. software) that causes hardware of the transmitter 202 to perform operations, e.g., processors functional blocks, and so on. For example, the transmitter 202 may include a computer-readable medium that may be configured to maintain instructions that cause the transmitter 202, and more particularly the operating system and associated hardware of the transmitter 202 to perform operations. Thus, the instructions function to configure the operating system and associated hardware to perform the operations and in this ways result in transformation of the operating system and associated hardware to perform functions. The instructions may be provided by the computer-readable medium to the transmitter 202 through a variety of different configurations.

One such configuration of a computer-readable medium is signal bearing medium and thus is configured to transmit the instructions (e.g. as a carrier wave) to the computing device, such as via a network. The computer-readable medium may also be configured as a computer-readable storage medium and thus is not a signal bearing medium. Examples of a computer-readable storage medium include a random-access memory (RAM), read-only memory (ROM), an optical disc, flash memory, hard disk memory, and other memory devices that may use magnetic, optical, and other techniques to store instructions and other data.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method of transmitting a data stream over a communication channel, the method comprising:
    identifying a plurality of forward error correction (FEC) data vectors corresponding to a correction data unit to be generated with respect to a plurality of original data packets of a data stream and to be transmitted from a transmitter to a receiver over a communication channel, wherein each of the plurality of FEC data vectors indicate respective ones of the original data packets for inclusion in generating the correction data unit;
    identifying a plurality of loss vectors each indicating predicted success of transmission for respective ones of the plurality of original data packets and the correction data unit, wherein each of the plurality of loss vectors is associated with an occurrence probability indicating a probability that the plurality of original data packets and the correction data unit are successfully transmitted as indicated by the respective loss vector;
    calculating a non-recovery probability for each of the plurality of FEC data vectors using the occurrence probabilities for each of the plurality of loss vectors, the non-recovery probability indicating a probability that a respective original data packet is lost and not recoverable using the correction data unit; and
    selecting an FEC data vector from the plurality of FEC data vectors having a least non-recovery probability;
    generating the correction data unit according to the selected FEC data vector; and
    transmitting the plurality of original data packets and the generated correction data unit over the communication channel.

2. The method of claim 1, wherein the FEC data vector selected from the plurality of FEC data vectors is defined by a predetermined number of original data packets selected from the plurality of original data packets.

3. The method of claim 1, wherein the occurrence probabilities for the plurality of loss vectors are identified using a network model.

4. The method of claim 3, wherein the network model is a Gilbert model.

5. The method of claim 1, wherein an FEC data vector of the first plurality of FEC data vectors is determined to contribute to the non-recovery probability of the particular original data packet where the particular original data packet is identified by a respective loss vector of the plurality of loss vectors as being lost and the corresponding correction data unit is identified by the respective loss vector as being lost.

6. The method of claim 1, further comprising updating the non-recovery probabilities based on at least one most recent data packet and on at least one most recent correction data unit transmitted from the transmitter to the receiver.

7. The method of claim 6, wherein updating the plurality of non-recovery probabilities comprises updating the occurrence probabilities for the plurality of loss vectors based on the at least one most recent data packet and the at least one most recent correction data unit.

8. A system for transmitting a data stream over a communication channel, the system comprising:
- a non-transitory computer-readable memory device storing computer-executable instructions; and
- one or more hardware processors that, having executed the computer-executable instructions, configure the system to:
- identify a plurality of forward error correction (FEC) data vectors corresponding to a correction data unit to be generated with respect to a plurality of original data packets of a data stream and to be transmitted from a transmitter to a receiver over a communication channel, wherein each of the plurality of FEC data vectors indicate respective ones of the original data packets for inclusion in generating the correction data unit;
- identify a plurality of loss vectors each indicating predicted success of transmission for respective ones of the plurality of original data packets and the correction data unit, wherein each of the plurality of loss vectors is associated with an occurrence probability indicating a probability that the plurality of original data packets and the correction data unit are successfully transmitted as indicated by the respective loss vector;
- calculate a non-recovery probability for each of the plurality of FEC data vectors using the occurrence probabilities for each of the plurality of loss vectors, the non-recovery probability indicating a probability that a respective original data packet is lost and not recoverable using the correction data unit; and
- select an FEC data vector from the plurality of FEC data vectors having a least non-recovery probability.

9. The system of claim 8, wherein the FEC data vector selected from the plurality of FEC data vectors is defined by a predetermined number of original data packets selected from the plurality of original data packets.

10. The system of claim 8, wherein the occurrence probabilities for the plurality of loss vectors are identified using a network model.

11. The system of claim 10, wherein the network model is a Gilbert model.

12. The system of claim 8, wherein an FEC data vector of the first plurality of FEC data vectors is determined to contribute to the non-recovery probability of the particular original data packet where the particular original data packet is identified by a respective loss vector of the plurality of loss vectors as being lost and the corresponding correction data unit is identified by the respective loss vector as being lost.

13. The system of claim 8, wherein the system is further configured to update the non-recovery probabilities based on at least one most recent data packet and on at least one most recent correction data unit transmitted from the transmitter to the receiver.

14. The system of claim 13, wherein the system is configured to update the plurality of non-recovery probabilities by updating the occurrence probabilities for the plurality of loss vectors based on the at least one most recent data packet and the at least one most recent correction data unit.

15. A system for transmitting a data stream over a communication channel, the system comprising:
- means for identifying a plurality of forward error correction (FEC) data vectors corresponding to a plurality of correction data unit to be generated with respect to a plurality of original data packets of a data stream and to be transmitted from a transmitter to a receiver over a communication channel, wherein each of the plurality of FEC data vectors indicate respective ones of the original data packets for inclusion in generating the correction data unit;
- means for determining identifying a plurality of loss vectors each indicating predicted success of transmission for respective ones of the plurality of original data packets and the correction data unit, wherein each of the plurality of loss vectors is associated with an occurrence probability indicating a probability that the plurality of original data packets and the correction data unit are successfully transmitted as indicated by the respective loss vector;
- means for calculating a non-recovery probability for each of the plurality of FEC data vectors using the occurrence probabilities for each of the plurality of loss vectors, the non-recovery probability indicating a probability that a respective original data packet is lost and not recoverable using the correction data unit; and
- means for selecting an FEC data vector from the plurality of FEC data vectors having a least non-recovery probability.

16. The system of claim 15, wherein the FEC data vector selected from the plurality of FEC data vectors is defined by a predetermined number of original data packets selected from the plurality of original data packets.

17. The system of claim 15, wherein the occurrence probabilities for the plurality of loss vectors are identified using a network model.

18. The system of claim 17, wherein the network model is a Gilbert model.

19. The system of claim 15, wherein an FEC data vector of the first plurality of FEC data vectors is determined to contribute to the non-recovery probability of the particular original data packet where the particular original data packet is identified by a respective loss vector of the plurality of loss vectors as being lost and the corresponding correction data unit is identified by the respective loss vector as being lost.

20. The system of claim 15, further comprising means for updating the non-recovery probabilities based on at least one most recent data packet and on at least one most recent correction data unit transmitted from the transmitter to the receiver.

* * * * *